(12) United States Patent
Briant et al.

(10) Patent No.: US 10,104,793 B2
(45) Date of Patent: Oct. 16, 2018

(54) EMI SHIELDING FOR PLUGGABLE MODULES AND CONNECTOR ASSEMBLIES

(71) Applicant: TE CONNECTIVITY CORPORATION, Berwyn, PA (US)

(72) Inventors: Eric David Briant, Dillsburg, PA (US); Charles Jameson Valentine, Lancaster, PA (US); James Charles Shiffler, Hershey, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/406,886

(22) Filed: Jan. 16, 2017

(65) Prior Publication Data

US 2018/0206353 A1    Jul. 19, 2018

(51) Int. Cl.
*H01R 13/648* (2006.01)
*H05K 5/02* (2006.01)
*H05K 5/00* (2006.01)
*H05K 9/00* (2006.01)

(52) U.S. Cl.
CPC ......... *H05K 5/0247* (2013.01); *H05K 5/0069* (2013.01); *H05K 5/0217* (2013.01); *H05K 9/002* (2013.01); *H05K 9/0009* (2013.01)

(58) Field of Classification Search
CPC .............. H01L 23/4006; F21V 29/004; H01R 13/65802; H05K 9/0058; G02B 6/4292
USPC ......... 439/485, 487, 607.01, 607.17, 607.18, 439/607.21, 607.25, 939; 385/92
See application file for complete search history.

(56) References Cited

U.S. PATENT DOCUMENTS

| | | | | |
|---|---|---|---|---|
| 6,478,622 B1 * | 11/2002 | Hwang | ............ | H01R 13/65802 385/92 |
| 7,438,596 B2 * | 10/2008 | Phillips | .............. | H01R 13/6582 439/607.01 |
| 7,455,554 B2 * | 11/2008 | Long | .................... | G02B 6/4201 439/607.17 |
| 7,641,515 B1 * | 1/2010 | Szczesny | ......... | H01R 13/65802 439/541.5 |
| 7,869,224 B1 * | 1/2011 | Yang | .................... | G02B 6/4284 174/350 |
| 8,053,667 B2 * | 11/2011 | Chen | .................... | H05K 9/0058 174/50 |
| 8,182,291 B2 * | 5/2012 | Tsou | .................. | H01R 23/6873 439/607.55 |
| 8,444,437 B2 * | 5/2013 | Szczesny | ........... | H01R 13/6587 361/704 |

(Continued)

*Primary Examiner* — Thanh Tam Le

(57) ABSTRACT

A connector assembly includes a cage member having a plurality of walls defining first and second module cavities configured to receive corresponding pluggable modules therein. The module cavities are separated by a separator wall. The connector assembly includes a separator spring plate along the separator wall. The separator spring plate has a base section coplanar with the separator wall along a separator wall plane. The separator spring plate has first separator spring beams extending out of the separator wall plane to a first side of the separator wall plane into the first module cavity to couple to the pluggable module received therein and second separator spring beams extending out of the separator wall plane to a second side of the separator wall plane into the second module cavity to electrically couple to the pluggable module received therein.

20 Claims, 6 Drawing Sheets

(56) References Cited

U.S. PATENT DOCUMENTS

| | | | |
|---|---|---|---|
| 8,449,331 B2* | 5/2013 | Phillips | H01R 13/6581 361/704 |
| 8,885,342 B2* | 11/2014 | Skepnek | H01L 23/367 174/548 |
| 8,890,004 B2* | 11/2014 | Wickes | H01R 13/6583 174/354 |
| 9,035,199 B2* | 5/2015 | Janota | H05K 9/0007 174/355 |
| 9,325,100 B2* | 4/2016 | Hirschy | H01R 13/6595 |
| 9,620,906 B1* | 4/2017 | Briant | H01R 13/6581 |
| 9,666,997 B1 | 5/2017 | Henry et al. | |

* cited by examiner

US 10,104,793 B2

EMI SHIELDING FOR PLUGGABLE MODULES AND CONNECTOR ASSEMBLIES

BACKGROUND OF THE INVENTION

The subject matter described herein relates to EMI shielding for pluggable modules and connector assemblies.

At least some known communication systems include receptacle connector assemblies, such as input/output (I/O) connector assemblies, that are configured to receive a pluggable module and establish a communicative connection between the pluggable module and a communication connector of the receptacle connector assembly. As one example, a known receptacle connector assembly includes a cage member that is mounted to a circuit board and configured to receive a small form-factor (SFP) pluggable transceiver. The receptacle connector assembly includes an elongated cavity that extends between an opening of the cavity and an electrical connector that is disposed within the cavity and mounted to the circuit board. The pluggable module is inserted through the opening and advanced toward the communication connector in the cavity. The pluggable module and the communication connector have respective electrical contacts that engage one another to establish a communicative connection.

One challenge often encountered in the design of the pluggable module and receptacle connector assembly is the containment and management of electromagnetic interference (EMI), which negatively affects module/system electrical performance. Typically, an EMI gasket is provided at the opening to contain EMI leakage in the system and/or to block EMI radiation from entering the system. Such EMI gaskets block substantially all of the space in the opening around the pluggable module with metal beams or fingers. However, such EMI gaskets have the negative effect of blocking airflow through the opening, which could be used to cool the pluggable module and other components of the system. Some known communication systems are designed to provide a large airflow channel at the opening to encourage airflow into or out of the cage member. The EMI gasket must be removed to provide the airflow channel.

Accordingly, there is a need for EMI shielding of pluggable modules for use in communication systems that allow significant airflow and heat transfer through the cage member.

BRIEF DESCRIPTION OF THE INVENTION

In an embodiment, a connector assembly is provided including a cage member having a plurality of walls defining first and second module cavities configured to receive corresponding pluggable modules therein. The first and second module cavities are separated by a separator wall of the plurality of walls. The walls are manufactured from a metal material and providing electrical shielding for the first and second module cavities. The connector assembly includes a separator spring plate along the separator wall. The separator spring plate has a base section coplanar with the separator wall along a separator wall plane. The separator spring plate has first separator spring beams extending out of the separator wall plane to a first side of the separator wall plane into the first module cavity to couple to the pluggable module received therein and second separator spring beams extending out of the separator wall plane to a second side of the separator wall plane into the second module cavity to electrically couple to the pluggable module received therein.

In another embodiment, a connector assembly is provided including a cage member having a plurality of walls defining first and second module cavities configured to receive corresponding pluggable modules therein through a front end of the cage member. The walls are manufactured from a metal material and provide electrical shielding for the first and second module cavities. The walls extend rearward from the front end toward a rear end of the cage member where at least some of the walls are configured to surround communication connectors at or near the rear end configured to be electrically connected to corresponding pluggable modules. The plurality of walls include a top wall, a bottom wall, first and second side walls, and a separator wall. The top wall, bottom wall and side walls define an exterior of the cage member. The separator wall extends between the top and bottom walls generally parallel to the first and second side walls and separate the first and second module cavities. The connector assembly includes an EMI skirt in the cage member at or near the communication connectors. The EMI skirt includes plural spring beams configured to surround a mating perimeter of the pluggable module forward of a mating end of the pluggable module configured to be mated with the communication connector. The EMI skirt has a bottom skirt member along the bottom wall, a first side skirt member along the first side wall, a second side skirt member along the second side wall and a separator spring plate along the separator wall. The separator spring plate has a base section coplanar with the separator wall along a separator wall plane and separator spring beams extending out of the separator wall plane on both sides of the separator wall plane. The separator spring beams have mating interfaces configured to engage and electrically connect to the pluggable modules in the corresponding first and second module cavities.

In a further embodiment, a communication system is provided including pluggable modules each having a pluggable body extending between a mating end and a cable end. The pluggable body has a top and an opposite bottom with sides extending therebetween along a length of the pluggable body. The pluggable body has a mating perimeter defined by the top, the bottom and the sides along a portion of the length forward of the mating end. The pluggable module has an internal circuit board held in the pluggable body. The communication system includes a connector assembly including a communication connector and a cage member. The cage member has a plurality of walls being manufactured from a metal material and providing electrical shielding. The walls of the cage member define first and second module cavities configured to receive corresponding pluggable modules therein. The first and second module cavities are separated by a separator wall of the plurality of walls and a separator spring plate along the separator wall. The separator spring plate has a base section coplanar with the separator wall along a separator wall plane. The separator spring plate has first separator spring beams extending out of the separator wall plane to a first side of the separator wall plane into the first module cavity to couple to the pluggable module received therein and second separator spring beams extending out of the separator wall plane to a second side of the separator wall plane into the second module cavity to electrically couple to the pluggable module received therein.

DETAILED DESCRIPTION OF THE INVENTION

Embodiments set forth herein include electromagnetic interference (EMI) shielding for communication systems, such as between cage members and pluggable modules. The pluggable module provides significant thermal transfer for the components thereof. Various embodiments of the communication system provide enhanced airflow through the cage member for heat dissipation of the pluggable module and an EMI shielding design that works with the enhanced airflow cage member. For example, exemplary embodiments set forth herein provide fins with the pluggable module that enhance transfer heat transfer and an air channel through the cage member that allows air to flow along the fins to cool the pluggable modules. In various embodiments, the EMI shielding is provided at the mating end of the pluggable module as opposed to at the bezel interface, as with conventional communication systems, which would block airflow through the cage member.

Figure 1:
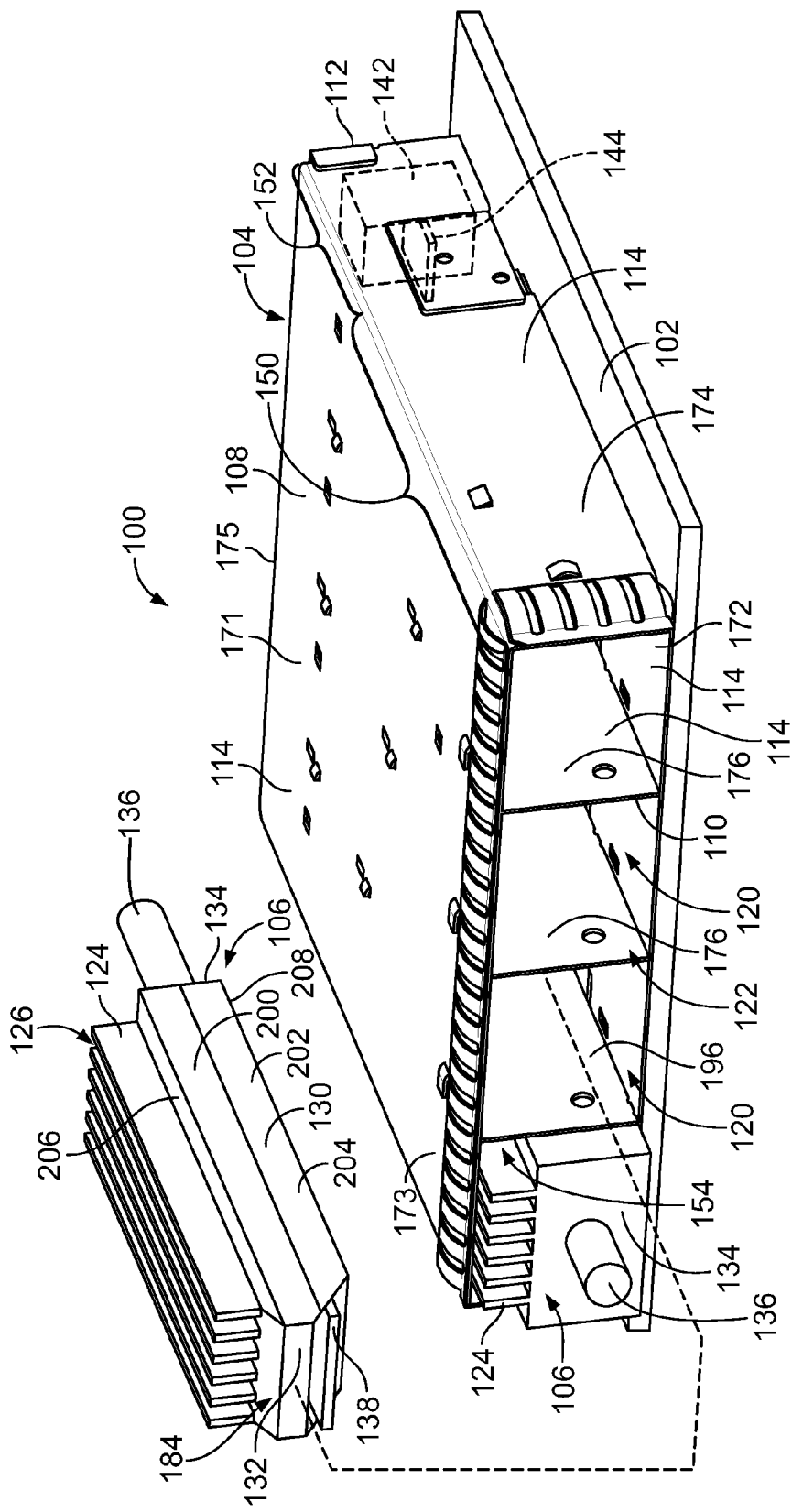
FIG. 1 is a front perspective view of a communication system including a connector assembly in accordance with an embodiment.

FIG. 1 is a front perspective view of a communication system 100 in accordance with an embodiment. The communication system 100 includes a circuit board 102, a receptacle connector assembly 104 mounted to the circuit board 102, and one or more pluggable modules 106 that are configured to communicatively engage the connector assembly 104 (one pluggable module 106 is shown mated to the connector assembly 104 and another pluggable module 106 is shown poised for mating with the connector assembly 104). The connector assembly 104 is illustrated as a multi-port assembly configured to receive multiple pluggable modules 106. The connector assembly 104 may have stacked and/or ganged ports.

The pluggable module 106 is an input/output (I/O) module configured to be inserted into and removed from the connector assembly 104. In some embodiments, the pluggable module 106 is a small form-factor pluggable (SFP) transceiver or quad small form-factor pluggable (QSFP) transceiver or a MicroQSFP transceiver. The pluggable module 106 may satisfy certain technical specifications for SFP, QSFP or MicroQSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, up to 28 Gbps, or more.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The connector assembly 104 includes a cage member 108 that is mounted to the circuit board 102. The cage member 108 may be arranged at a bezel or faceplate of a chassis of the system or device, such as through an opening in the faceplate. As such, the cage member 108 is interior of the device and corresponding faceplate and the pluggable modules 106 are loaded into the cage member 108 from outside or exterior of the device and corresponding faceplate.

The cage member 108 includes a front end 110 and an opposite rear end 112. The front end 110 may be provided at, and extend through an opening in, the faceplate. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the connector assembly 104.

The cage member 108 is configured to contain or block electromagnetic interference (EMI) and guide the pluggable modules 106 during a mating operation. To this end, the cage member 108 includes a plurality of walls 114 that are interconnected with one another to form the cage member 108. The walls 114 may be formed from a conductive material, such as sheet metal and/or a polymer having conductive particles. In the illustrated embodiment, the walls 114 are stamped and formed from sheet metal. In some embodiments, the cage member 108 is configured to facilitate airflow through the cage member 108 to transfer heat (or thermal energy) away from the connector assembly 104 and pluggable module(s) 106. The air may flow from inside the cage member 108 (for example, behind the faceplate) to the external environment (for example, forward of the faceplate) or from outside the cage member 108 into the interior of the cage member 108. Fans or other air moving devices may be used to increase airflow through the cage member 108 and over the pluggable module(s) 106.

In the illustrated embodiment, the cage member 108 includes a plurality of module cavities 120. The cage member 108 may include any number of module cavities 120, which may be stacked vertically and/or stacked horizontally. The module cavities 120 extends between the front and rear ends 110, 112. The module cavities 120 each have a port opening 122 that is sized and shaped to receive the corresponding pluggable module 106. The module cavity 120 extends lengthwise in a direction that is parallel to a mating axis with the pluggable module 106.

In some embodiments, the pluggable module 106 is an input/output cable assembly having a pluggable body 130. The pluggable body 130 includes a mating end 132 and an opposite cable end 134. A cable 136 is coupled to the pluggable body 130 at the cable end 134. The pluggable body 130 also includes an internal circuit board 138 that is communicatively coupled to electrical wires or optical fibers (not shown) of the cable 136. The cable 136 may be communicatively coupled by directly terminating the wires to the internal circuit board 138, such as by soldering the wires to the internal circuit board. Alternatively, the cable 136 may be communicatively coupled by other processes, such as by using connectors at the end of the cable 136 and on the internal circuit board 138. The internal circuit board 138 is supported by the pluggable body 130. The mating end 132 is configured to be inserted into the module cavity 120 of the cage member 108 and advanced in a mating direction along a mating axis.

In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138. In an exemplary embodiment, the pluggable body 130 includes a plurality of heat transfer fins 124 along at least a portion of the outer perimeter of the pluggable module 106. For example, in the illustrated embodiment, the fins 124 are provided along the top; however the fins 124 may additionally or alternatively be provided along the sides and/or the bottom. The fins 124 transfer heat away from the main shell of the pluggable body 130, and thus from the internal circuit board 138 and associated components. The fins 124 are separated by gaps 126 that allow airflow or other cooling flow along the surfaces of the fins 124 to dissipate the heat therefrom. In the illustrated embodiment, the fins 124 are parallel plates that extend lengthwise, such as parallel to the mating axis; however the fins 124 may have other shapes in alternative embodiments, such as cylindrical or other shaped posts.

The fins 124 increase the overall height and/or width of the pluggable module 106 and the port opening 122 is sized to accommodate the fins 124 and allow the pluggable module 106, including the fins 124, to be loaded therethrough into the module cavity 120. In an exemplary embodiment, the module cavity 120 is at least partially open (for example, includes openings) at the front end 110 and the rear end 112, generally in line with the fins 124, to allow airflow through the module cavity 120 to enhance heat transfer. Such openings may be sized to control EMI emissions therethrough. Heat is transferred from at or near the mating end 132, such as where various electrical components are located on the internal circuit board 138, to the cable end 134 by the shell of the pluggable body 130 and the fins 124. The heat is pulled out of the connector assembly 104 by forward airflow through the module cavity 120 and rejected to the external environment forward of the faceplate. In other embodiments, the heat may be drawn into other portions of the pluggable body 130 and/or the heat may be directed to other portions of the pluggable body 130, such as toward the mating end 132, where the heat may be transferred to another heat sink or heat transferring component inside the chassis or be rejected by rearward airflow to the external environment through the rear end 112.

The connector assembly 104 includes communication connectors 142 having corresponding mating interfaces 144 (both shown in phantom) configured to mate with the pluggable modules 106. The communication connectors 142 and mating interfaces 144 are disposed within corresponding module cavities 120. The mating interfaces 144 are generally aligned with the port openings 122 and positioned near the rear end 112. Each mating interface 144 includes electrical contacts, such as spring beams that are configured to directly engage the contact pads of the internal circuit board 138 of the pluggable module 106. The communication connectors 142 are configured to be mounted to the circuit board 102. The communication connectors 142 are received in the cage member 108 through the bottom. For example, the cage member 108 is configured to be mounted to the circuit board 102 over the communication connectors 142 such that the communication connectors 142 pass through an opening(s) in the bottom as the cage member 108 is mounted to the circuit board 102.

The cage member 108 generally defines various portions or segments that receive different components and/or serve different functions. For example, in an exemplary embodiment, the module cavity 120 is divided into a pluggable module segment 150 and a communication connector segment 152 rearward of the pluggable module segment 150. The pluggable module segment 150 is at or near the front end 110 and receives the pluggable module 106. The communication connector segment 152 is at or near the rear end 112 and receives the communication connector 142. The pluggable module segment 150 may intersect with and/or overlap with the communication connector segment 152. The pluggable module 106 is mated with the communication connector 142 generally at the intersection between the segments 150, 152. For example, the mating interface 144 may be positioned generally at the intersection of the pluggable module section 150 and the communication connector section 152.

In an exemplary embodiment, each module cavity 120 includes an airflow channel 154 that allows airflow through the module cavity 120. For example, in the illustrated embodiment, the airflow channel 154 is an upper airflow channel 154 positioned along the top of the module cavity 120. The upper airflow channel 154 is located above the pluggable module 106 and allows airflow along the fins 124. In an exemplary embodiment, the airflow channel 154 is open at the front end 110 and at the rear end 112 to allow airflow through the module cavity 120 along the pluggable module 106. For example, the cage member 108 includes airflow openings 156 (shown in FIG. 2) in the cage wall 114 at the rear end 112 to allow airflow through such wall. The airflow openings 156 may be located above the communication connector 142. The airflow openings 156 may be located at other locations in alternative embodiments. The airflow openings 156 may be sized to limit or reduce EMI leakage through the cage wall 114 at the rear end 112.

In some embodiments, the cage member 108 is formed from a plurality of interconnected panels or sheets, which define the walls 114. For example, the cage member 108 includes a top wall 171, a bottom wall 172, first and second side walls 173, 174 and a rear wall 175 at the rear end 112. The cage member 108 may include a front wall at the front end 110 or other walls. In an exemplary embodiment, the walls 114 include one or more separator walls 176 that divide the cage member 108 into the separate module cavities 120. Module cavities 120 are provided on both sides of the separator walls 176.

The panels or sheets may be stamped and formed from sheet metal. The bottom wall 172 is configured to rest on the circuit board 102. In an exemplary embodiment, the bottom wall 172 includes one or more communication connector openings 178 (shown in FIG. 2) therethrough that receive the communication connectors 142 extending from the circuit board 102. The cage member 108 may be mounted onto the circuit board 102 over the communication connectors 142 such that the communication connectors 142 are loaded into the module cavity 120. When the cage member 108 is mounted to the circuit board 102, the cage member 108 is electrically coupled to the circuit board 102 and, in particular, to ground planes (not shown) within the circuit board 102 to electrically ground the cage member 108. As such, the connector assembly 104 may reduce EMI that may negatively affect electrical performance of the communication system 100.

In an exemplary embodiment, the connector assembly 104 includes one or more EMI skirts 180 (shown in FIG. 2), which are positioned in each of the module cavities 120 near the communication connectors 142. The EMI skirt 180 is interior of the cage walls 114 and faces the interior of the module cavity 120, such as the corresponding pluggable module 106 in the module cavity 120. The EMI skirt 180 is electrically connected to the walls 114 surrounding the associated module cavity 120. The EMI skirt 180 may reduce EMI leakage from the cage member 108, from the communication connector 142 and/or from the pluggable module 106. Optionally, the EMI skirt 180 may include discrete members that surround different portions of the pluggable module 106 and module cavity 120.

Each EMI skirt 180 is configured to surround a mating perimeter 184 of the corresponding pluggable module 106 forward of the mating end 132 (for example, toward the cable end 134 from the mating end 132) of the pluggable module 106. Optionally, the mating perimeter 184 may be at or near the mating end 132, such as closer to the mating end 132 than the cable end 134. Providing the EMI skirt 180 interior of the module cavity 120 at the mating end 132 moves the EMI component away from the front end 110 and the port opening 122 to the module cavity 120, which leaves the airflow channel 154 open to allow airflow therethrough for cooling the pluggable module 106. For example, conventional cage members provide EMI shielding at the front end 110 to close off the opening to the module cavity using EMI springs or shields that would otherwise block airflow into the module cavity.

The pluggable body 130 defines a shell around the internal circuit board 138. Optionally, the pluggable body 130 may be defined by first and second shells 200, 202 that are joined together above and below the internal circuit board 138. The first and second shells 200, 202 meet along sides 204 of the pluggable body 130. The first shell 200 defines an upper end or top 206 of the pluggable body 130, and the second shell 202 defines a lower end or bottom 208 of the pluggable body 130. In an exemplary embodiment, the EMI skirt 180 surrounds and engages the top 206, bottom 208 and opposite sides 204 of the pluggable module 106. For example, the top 206, the bottom 208 and the sides 204 at the mating end 132 define the mating perimeter 184 of the pluggable module 106.

Figure 2:
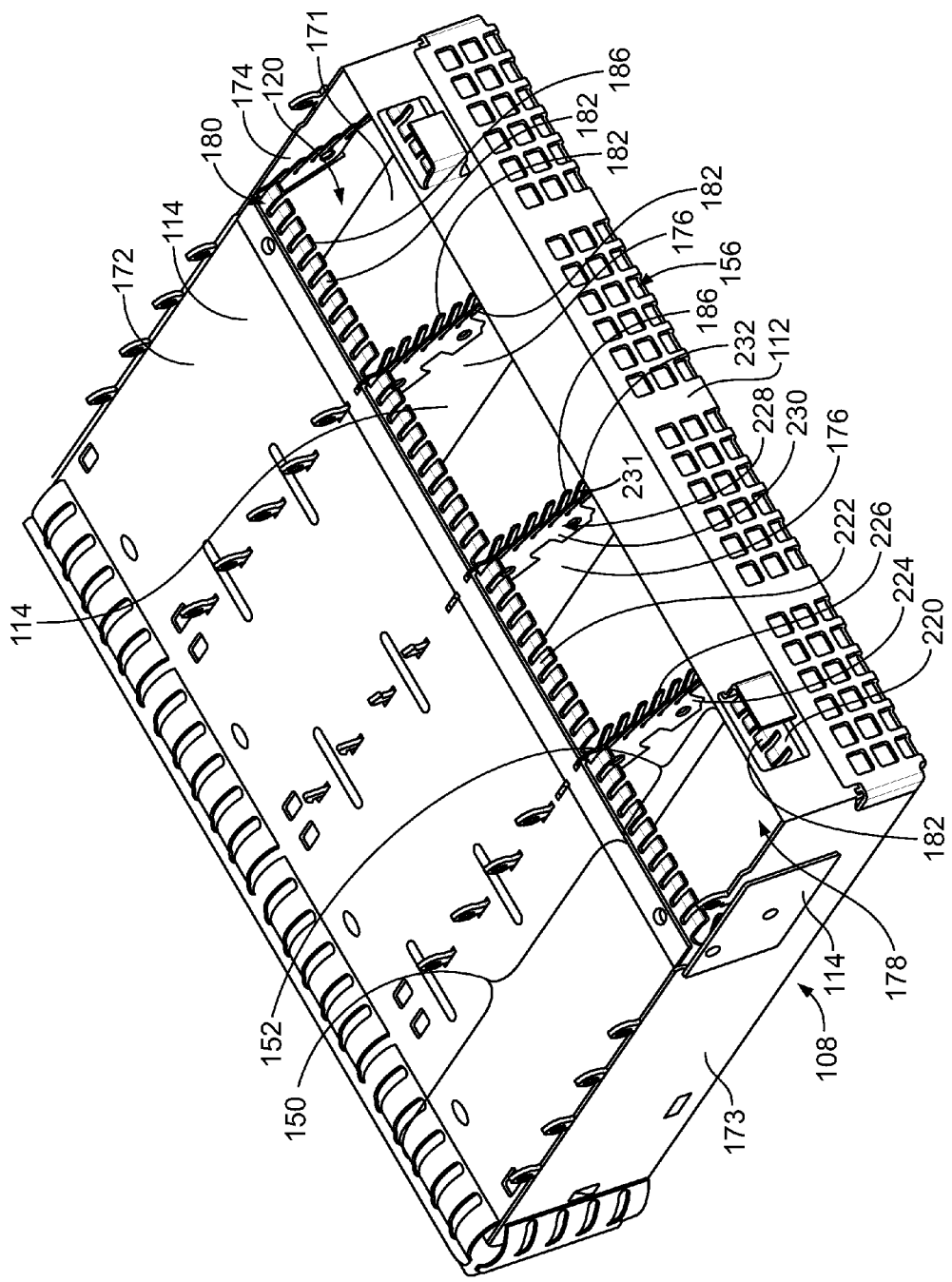
FIG. 2 is a bottom perspective view of a cage member of the connector assembly including a separator spring plate in accordance with an exemplary embodiment.

FIG. 2 is a bottom perspective view of the cage member 108 in accordance with an exemplary embodiment. FIG. 2 illustrates the communication connector opening 178 in the bottom wall 172 of the cage member 108. In the illustrated embodiment, the communication connector opening 178 is positioned immediately forward of the rear end 112. The EMI skirts 180 are generally aligned with the communication connector opening 178 interior of the module cavity 120.

The EMI skirts 180 include plural spring beams 182 extending into the corresponding module cavities 120. The spring beams 182 extend into the module cavities 120 to interfere with the pluggable modules 106 (shown in FIG. 1) when the pluggable modules 106 are mated with the communication connectors 142 (shown in FIG. 1). The spring beams 182 are deflectable and are elastically deformed against the mating perimeter 184 when the pluggable module 106 is mated with the communication connector 142. The spring beams 182 having mating interfaces 186 configured to engage and electrically connect to the pluggable module 106, such as to the pluggable body 130.

In the illustrated embodiment, each EMI skirt 180 includes a plurality of skirt members each mounted to a different cage wall 114 of the cage member 108 to surround the module cavity 120. For example, the EMI skirt 180 includes a top skirt member 220 (shown in FIG. 5), a bottom skirt member 222, a first side skirt member 224 and a second side skirt member 226 each being mounted to a different one of the cage walls 114. For example, the top skirt member 220 is mounted to an interior wall near the top wall 171. The bottom skirt member 222 is mounted to the bottom wall 172. The first side skirt member 224 is mounted to either the first side wall 173 or one of the separator walls 176, depending on the module cavity 120 associated with the EMI skirt 180. The second side skirt member 226 is mounted to either the second side wall 174 or one of the separator walls 176, depending on the module cavity 120 associated with the EMI skirt 180.

In an exemplary embodiment, each separator wall 176 has first and second side skirt members 224, 226 arranged back-to-back to define a separator spring plate 228 coupled to the separator wall 176. The separator spring plate 228 has spring beams 182 extending into both adjacent module cavities 120. In an exemplary embodiment, at least some of the skirt members may be shifted or offset with respect to other skirt members. For example, the top skirt member 220 is offset rearward of the bottom skirt member 222. The first and second side skirt members 224, 226 are angled generally between the top and bottom skirt members 220, 222. Other arrangements are possible in alternative embodiments.

Each skirt member includes a base section 230 mounted to the corresponding wall 114 and the spring beams 182 extending from the base section 230. The base section 230 may be mounted to the corresponding wall 114 by any known process. For example, the base section 230 may be soldered or welded to the wall 114. In alternative embodiments, the base section 230 may be integral with the corresponding wall 114 rather than being separately provided and mounted thereto.

The base section 230 may be generally planar having the spring beams 182 extending from an edge thereof. In an exemplary embodiment, the base section 230 and spring beams 182 are integrally formed. For example, the base section 230 and spring beams 182 may be stamped and formed from a common blank or sheet of metal material. The spring beams 182 may be curved or arc shaped between fixed ends 231 at the base section 230 and corresponding distal ends 232. The mating interfaces 186 are located along the curved spring beams 182, such as remote from the base section 230 and remote from a distal ends 232. Optionally, the distal ends 232 may be tied together using tie bars rather than being free.

In an exemplary embodiment, the spring beams 182 of the top skirt member 220 (defining a first set of spring beams) are offset rearward of the spring beams 182 of the bottom skirt member 222 (defining a second set of spring beams). The spring beams 182 of the side skirt members 224, 226 may be stepped or staggered between the top and bottom skirt members 220, 222. In an exemplary embodiment, the spring beams 182 of the top skirt member 220 extend forward to the distal ends 232, while the spring beams 182 of the bottom skirt member 222 extend rearward to the distal ends 232. In the illustrated embodiment, the spring beams 182 of the side skirt members 224, 226 extend rearward to the distal ends 232. As such, the pluggable module 106 initially passes the base sections 230 of the bottom skirt member 222 and side skirt members 224, 226 before interfacing with the spring beams 182, whereas the pluggable module 106 initially engages the spring beams 182 of the top skirt member 220. The distal ends 232 of the spring beams 182 of the top skirt member 220 are flared upward so as to not interfere with loading of the pluggable module 106 into the module cavity 120 during mating with the communication connector 142.

The EMI skirt 180 provides EMI shielding around the mating interface between the pluggable modules 106 and the communication connectors 142, such as around the mating interface 144 of the communication connector 142 and/or around the mating perimeter 184 of the pluggable module 106. The EMI skirt 180 is located generally at the intersection between the pluggable module segment 150 and the communication connector segment 152. The EMI skirt 180 is generally aligned with the communication connector opening 178. The EMI skirt 180 is located relative to the communication connector opening 178 such that the EMI skirt 180 does not interfere with loading of the communication connectors 142 into the module cavities 120 as the cage member 108 is mounted to the circuit board 102. For example, the bottom skirt member 222 is offset forward, such as near the forward end of the communication connector opening 178 such that the distal ends 232 of the spring beams 182 clear the forward or mating end of the communication connector 142.

Figure 4:
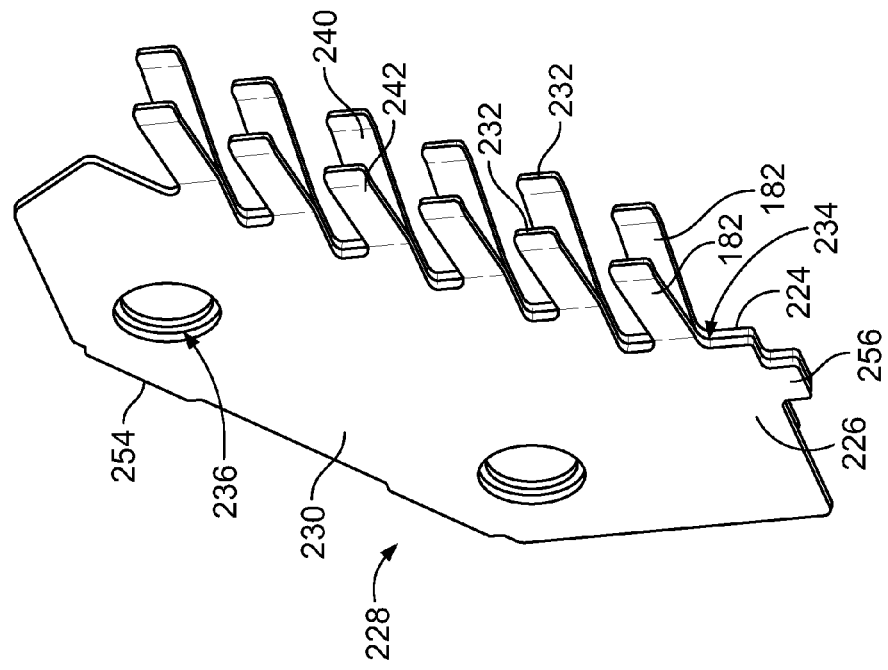
FIG. 4 is a perspective view of the separator spring plate.
Figure 3:
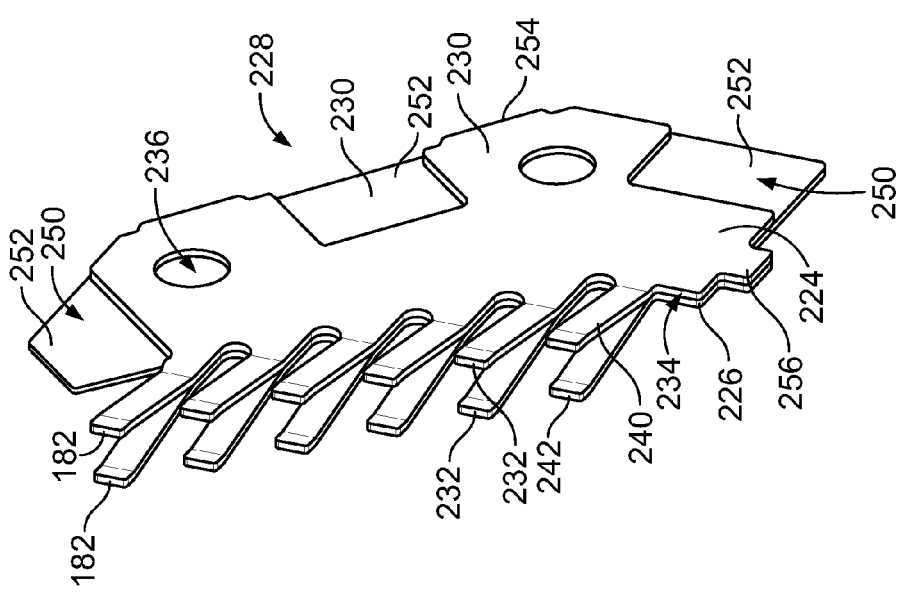
FIG. 3 is a perspective view of the separator spring plate in accordance with an exemplary embodiment having first and second side skirt members.

FIG. 3 is a perspective view of the separator spring plate 228 viewing the first side skirt member 224. FIG. 4 is a perspective view of the separator spring plate 228 viewing the second side skirt member 226. The first and second side skirt members 224, 226 may be similar and include similar components. The description herein is described in reference to both skirt members 224, 226, unless otherwise noted. Like component may be identified with like reference numerals.

In an exemplary embodiment, the separator spring plate 228 is formed from the two side skirt members 224, 226 arranged back-to-back and coupled together; however, the separator spring plate 228 may be manufactured from a single plate rather than the pair of skirt members. The side skirt members 224, 226 may be mechanically and electrically connected together, such as by welding. For example, the base sections 230 may be coupled together at a seam 234 extending along a plane of the separator spring plate 228. In an exemplary embodiment, the base sections 230 include alignment openings 236 configured to be aligned with each other to position the first side skirt member 224 relative to the second side skirt member 226.

The spring beams 182 of the separator spring plate 228 extend rearward from the base sections 230. For example, the spring beams 182 of the first side skirt member 224 define first separator spring beams 240, and the spring beams 182 of the second side skirt member 226 define second separator spring beams 242. In an exemplary embodiment, the first and second separator spring beams 240, 242 are aligned with each other and extend outward away from each other. The separator spring beams 240, 242 are deflectable and are configured to be deflected inward toward each other when mated with the corresponding pluggable modules 106. Having the separator spring beams 240, 242 extend in opposite directions allows the separator spring plate 228 to be electrically connected to both of the pluggable modules 106. Having multiple first separator spring beams 240 engaging one of the pluggable modules 106 and multiple second separator spring beams 242 engaging another of the pluggable modules 106 provides a robust electrical connection and EMI shielding between the separator spring plate 228 and both adjacent pluggable modules 106.

Providing both the first and second side skirt members 224, 226 allows forming of first and second separator spring beams 240, 242 from different pieces using the metal used to manufacture the side skirt members 224, 226. For example, the separator spring beams 240, 242 may be stamped and formed with the corresponding side skirt members 224, 226. Providing different side skirt members 224, 226 allows tighter positioning of the separator spring beams 240, 242 as compared to a separator spring plate 228 manufactured from a single plate of material, such as where alternating spring beams extend to alternating sides thereof for engaging both adjacent pluggable modules 106. For example, in the illustrated embodiment, the separator spring beams 240, 242 have a height greater than a vertical spacing between the next adjacent separator spring beam 240, 242, which would not be possible if both separator spring beams 240, 242 were stamped from the same piece of metal. Having the separator spring beams 240, 242 tightly positioned along the separator spring plate 228 provides efficient EMI shielding with the pluggable modules 106. Optionally, rather than having the separator spring beams 240, 242 aligned across from each other, the separator spring beams 240, 242 may be offset or staggered such that the first separator spring beams 240 cover the gaps between the second separator spring beams 242, and the second separator spring beams 242 cover the gaps between the first separator spring beams 240.

In an exemplary embodiment, the first side skirt member 224 includes one or more notches 250 formed therein. When the first side skirt member 224 is coupled to the second side skirt member 226 the notches 250 expose mounting lands 252 of the second side skirt member 226. The mounting lands 252 are used to secure the separator spring plate 228 to the separator walls 176 (shown in FIG. 1). The mounting lands 252 are provided along a front edge 254 of the separator spring plate 228. In the illustrated embodiment, the separator spring plate 228 includes one mounting land 252 near the top of the separator spring plate 228, another mounting land 252 near a bottom of the separator spring plate 228, and another mounting land 252 near a middle of the separator spring plate 228. Other locations are possible in alternative embodiments.

In an exemplary embodiment, the separator spring plate 228 includes a mounting tab 256 extending therefrom. The mounting tab 256 is used for mounting the separator spring plate 228 to one of the walls 114 (shown in FIG. 1). For example, the mounting tab 256 may be used to mechanically and electrically connect the separator spring plate 228 to the corresponding wall 114. The mounting tab 256 may be used to electrically connect the separator spring plate 228 to another skirt member, such as the bottom skirt member 222 (shown in FIG. 2). In the illustrated embodiment, the mounting tab 256 is provided along the bottom of the separator spring plate 228; however, the mounting tab 256 may be provided at other locations in alternative embodiments. The mounting tab 256 is used to mechanically and electrically connect the separator spring plate 228 to the separator wall 176. Optionally, both the first and second side skirt members 224, 226 include tab portions that together define the mounting tab 256. Alternatively, only one of the side skirt members 224, 226 may include the mounting tab 256.

Figure 5:
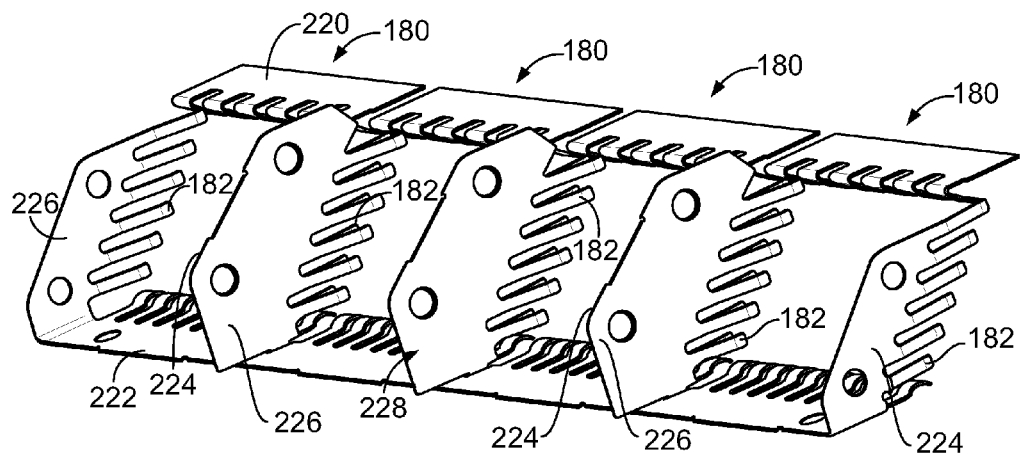
FIG. 5 is a front perspective view of EMI skirts including the separator spring plates.

FIG. 5 is a front perspective view of the EMI skirts 180 arranged relative to each other for a four cavity connector assembly 104. FIG. 5 shows four top skirt members 220, four bottom skirt members 222, one of the first side skirt members 224 at the outer side, one of the second side skirt members 226 at the opposite outer side, and three separator spring plates 228 defined by the corresponding first and second side skirt members 224, 226 arranged back-to-back and configured to be positioned between the adjacent module cavities 120 on flanking sides thereof. Optionally, the outer side skirt members 224, 226 (not the ones used to form one of the separator spring plates 228) may have different shapes and/or features than the inner side skirt members 224, 226 used for the separator spring plates 228. Other arrangements are possible in alternative embodiments. The spring beams 182 are arranged relative to each other to define a reception space for the corresponding pluggable module 106.

In an exemplary embodiment, all of the bottom skirt members 222 are integrally formed from a common sheet of metal rather than being separate, discrete skirt members. Optionally, the first side skirt members 224 at the outer side and the second side skirt members 226 at the opposite outer side are integrally formed with the corresponding adjacent bottom skirt member 222 from a common sheet of metal rather than being separate, discrete skirt members. Optionally, all of the top skirt members 220 are integrally formed from a common sheet of metal rather than being separate, discrete skirt members.

Figure 6:
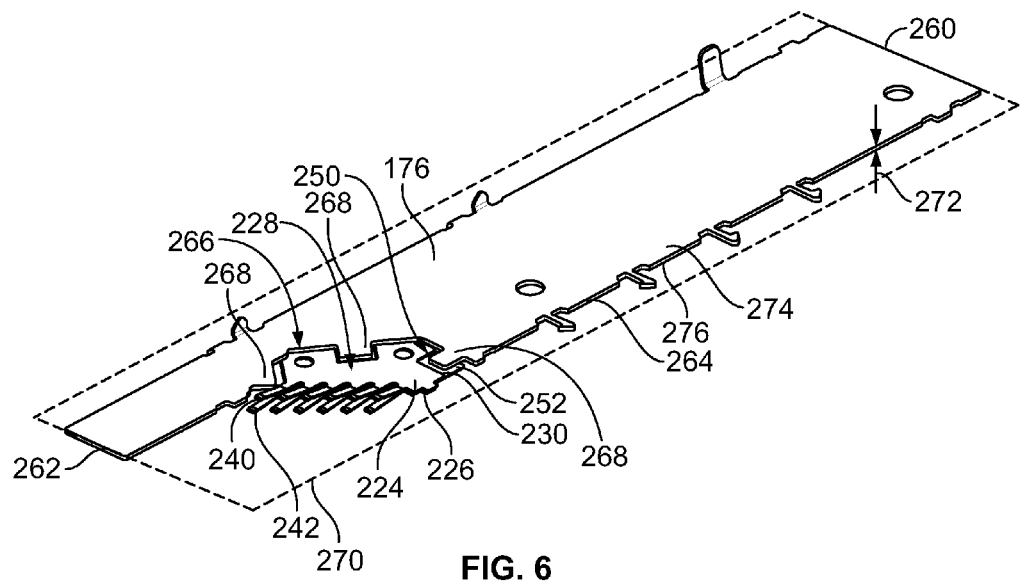
FIG. 6 is a bottom perspective view of a separator wall having a separator spring plate.

FIG. 6 is a bottom perspective view of one of the separator walls 176 having the corresponding separator spring plate 228 coupled thereto. The separator wall 176 extends from a front edge 260 to a rear edge 262. The separator wall 176 has a bottom edge 264 extending from the front edge 260 toward the rear edge 262. The separator wall 176 has a pocket 266 that receives the separator spring plate 228. The separator wall 176 includes mounting tabs 268 extending into the pocket 266. The separator spring plate 228 is connected to the mounting tabs 268, such as by welding. In an exemplary embodiment, the mounting tabs 268 are received in the notches 250 of the first side skirt member 224 to engage the mounting lands 252 of the second side skirt member 226. The mounting tabs 268 may be welded to the mounting lands 252. By electrically connecting the separator spring plate 228 to the separator wall 176, the separator spring plate 228 and the separator wall 176 provide EMI shielding for the module cavities 120 on opposite sides of the separator wall 176.

The separator wall 176 is generally planar and extends along a separator wall plane 270. The separator spring plate 228 is coplanar with the separator wall plane 270. For example, the base sections 230 of the first and second side skirt members 224, 226 are coplanar and lie within with the separator wall plane 270. The first and second separator spring beams 240, 242 extend out of the separator wall plane 270 to corresponding sides of the separator wall plane 270 for interfacing with the pluggable modules 106 when loaded into the corresponding module cavities 120.

In an exemplary embodiment, the separator wall 176 has a width 272 defined between first and second sides 274, 276 thereof. The first and second sides 274, 276 define the separator wall plane 270. In an exemplary embodiment, the separator spring plate 228 has a thickness no wider than the width 272 of the separator wall 176. As such, the separator spring plate 228 does not increase the width of the separator wall 176, allowing tighter spacing between the module cavities 120 as compared to an embodiment having the side skirt members mounted to the first and second sides 274, 276 and thus extending into the corresponding module cavities 120. The only portions of the separator spring plates 228 that extend into the module cavities 120 are the separator spring beams 240, 242 which are deflectable when engaged by the pluggable modules 106, being deflected out of the module cavities 120 by the pluggable modules 106, such as to positions generally coplanar with the separator wall plane 270. In an exemplary embodiment, the first side skirt member 224 may have a width approximately half of the width 272 of the separator wall 176, and the second side skirt member 226 may have a width approximately half the width 272 of the separator wall 176.

Figure 7:
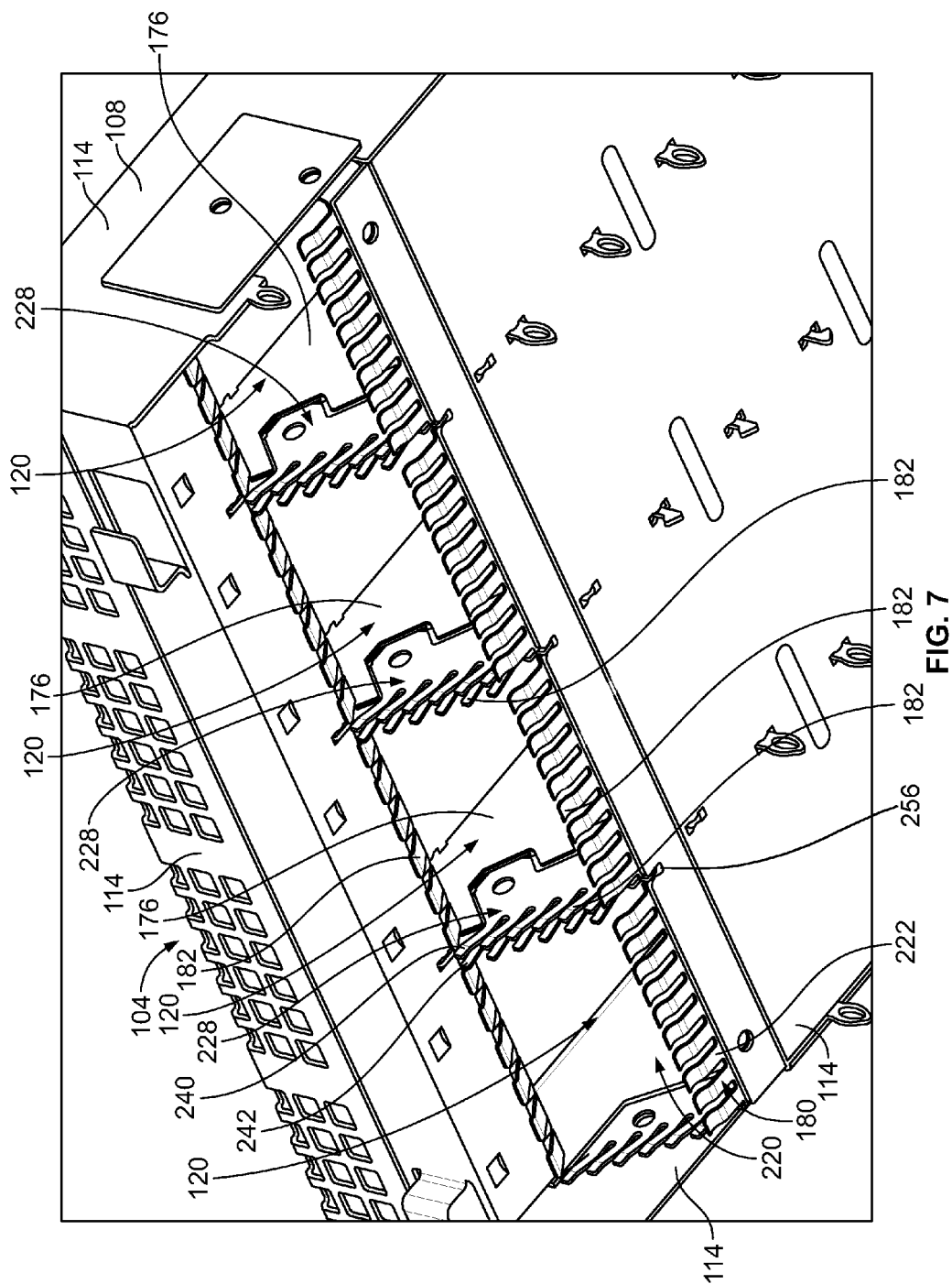
FIG. 7 is a bottom perspective view of portions of the connector assembly showing the EMI skirts and separator spring plates.
Figure 8:
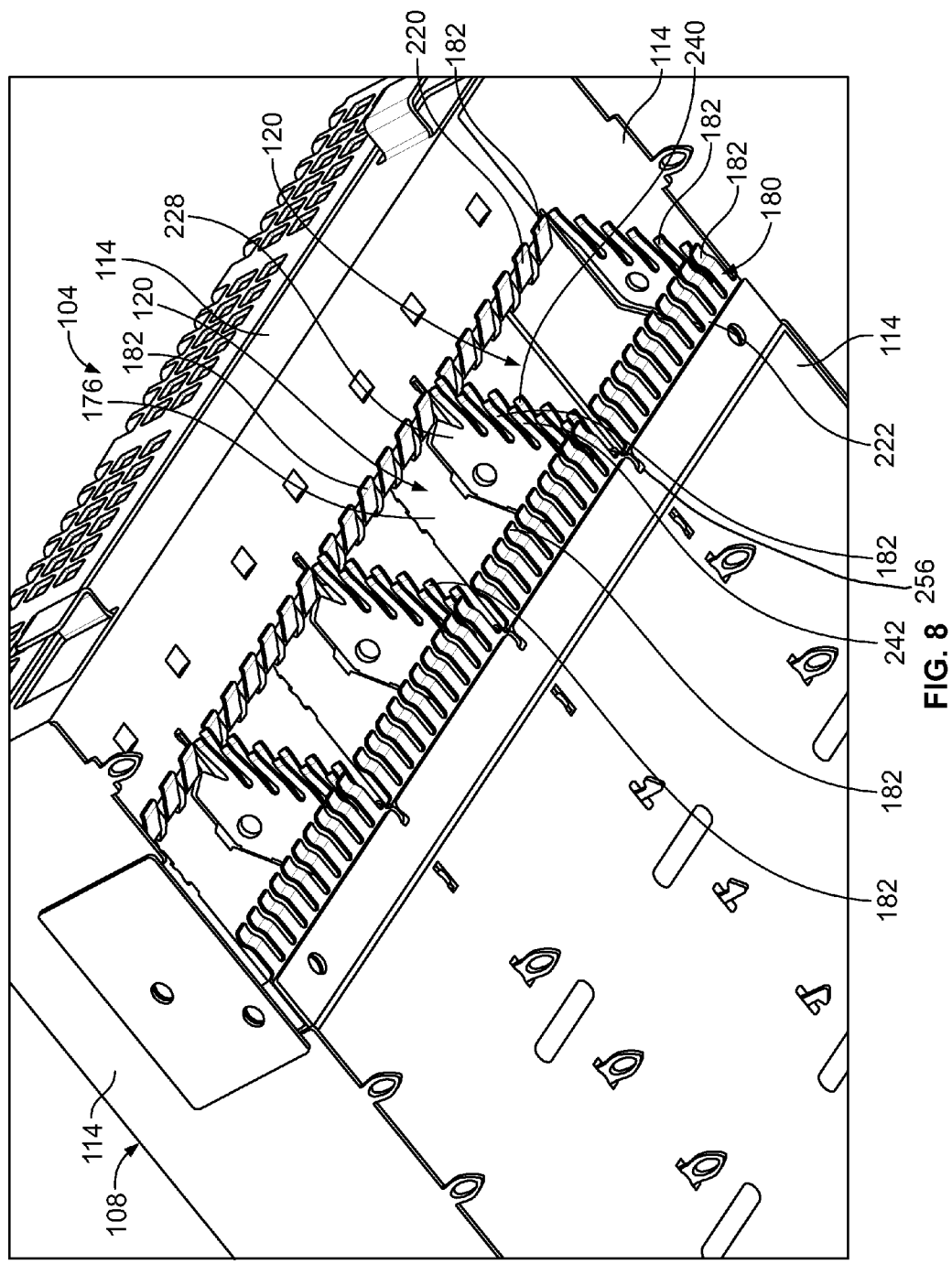
FIG. 8 is a bottom perspective view of portions of the connector assembly showing the EMI skirts and separator spring plates.

FIGS. 7 and 8 are bottom perspective views of portions of the connector assembly 104 showing the EMI skirts 180 coupled to the walls 114 of the cage member 108. The separator walls 176 and the separator spring plates 228 are provided between corresponding adjacent module cavities 120. The separator spring beams 240, 242 extend away from each other into the corresponding module cavities 120 on both sides of the separator walls 176. The separator spring beams 240, 242, as well as the spring beams 182 of the top and bottom skirt members 220, 222, entirely surround the reception space configured to receive the pluggable modules 106 to provide EMI shielding around the entire mating interface between the pluggable module 106 and the communication connector 142 (shown in FIG. 1).

When assembled, the walls 114 are electrically connected to each other. The EMI skirts 180 are electrically connected to the walls 114. In an exemplary embodiment, the separator spring plates 228 are directly electrically connected to the bottom skirt members 222 by the mounting tabs 256. Having the walls 114 and the EMI skirt members electrically connected together provides EMI shielding for the pluggable modules 106.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A connector assembly comprising:
a cage member having a plurality of walls extending between a front end and a rear end, the walls defining first and second module cavities configured to receive corresponding pluggable modules therein through the front end, the first and second module cavities being arranged side-by-side and being defined by a top wall and a bottom wall of the plurality of walls with the bottom wall extending along a circuit board, the first and second module cavities being separated by a separator wall of the plurality of walls, the separator wall being a solid wall devoid of an interior chamber oriented vertically between the top wall and the bottom wall between the first and second module cavities, the walls being manufactured from a metal material and providing electrical shielding for the first and second module cavities; and
a separator spring plate coupled to the separator wall, the separator spring plate having a base section coplanar with the separator wall along a separator wall plane, the separator spring plate having first separator spring beams extending out of the separator wall plane to a first side of the separator wall plane into the first module cavity to couple to the corresponding pluggable module received therein, the separator spring plate having second separator spring beams extending out of the separator wall plane to a second side of the separator wall plane into the second module cavity to electrically couple to the corresponding pluggable module received therein.

2. The connector assembly of claim 1, wherein the first and second separator spring beams are aligned with each other on the opposite first and second sides.

3. The connector assembly of claim 1, wherein the separator wall is a single wall being vertically oriented and extending between the front end and the rear end between the first and second module cavities, the base section of the separator spring plate has a thickness no wider than a width of the separator wall.

4. The connector assembly of claim 1, wherein the separator spring plate includes a first side skirt member and a second side skirt member aligned back-to-back, the first separator spring beams extending from the first side skirt member, the second separator spring beams extending from the second side skirt member.

5. The connector assembly of claim 4, wherein the first side skirt member has a width approximately half a width of the separator wall and the second side skirt member has a width approximately half the width of the separator wall.

6. The connector assembly of claim 4, wherein the separator wall includes mounting tabs, the separator spring plate having mounting lands mechanically and electrically coupled to corresponding mounting tabs.

7. The connector assembly of claim 1, wherein the separator spring plate includes at least one mounting tab configured to be mechanically and electrically coupled to at least one of the walls of the plurality of walls.

8. The connector assembly of claim 1, wherein the separator wall includes a pocket receiving the separator spring plate, the separator spring plate being mechanically and electrically coupled to the separator wall in the pocket.

9. The connector assembly of claim 1, wherein each of the first and second separator spring beams extend between fixed ends and distal ends, each of the first and second separator spring beams being deflectable about the fixed ends, the distal ends being configured to electrically engage the corresponding pluggable modules.

10. A connector assembly comprising:
a cage member having a plurality of walls defining first and second module cavities configured to receive corresponding pluggable modules therein through a front end of the cage member, the walls being manufactured from a metal material and providing electrical shielding for the first and second module cavities, the walls extending rearward from the front end toward a rear end of the cage member where at least some of the walls are configured to surround communication connectors at or near the rear end configured to be electrically connected to corresponding pluggable modules, the plurality of walls including a top wall, a bottom wall, first and second side walls, and a separator wall, the top wall, the bottom wall and the first and second side walls defining an exterior of the cage member, the separator wall extending between the top wall and the bottom wall generally parallel to the first and second side walls and separating the first and second module cavities, the separator wall being a solid wall devoid of an interior chamber; and
an EMI skirt in the cage member at or near the communication connectors, the EMI skirt comprising plural spring beams configured to surround a mating perimeter of the corresponding pluggable module forward of a mating end of the corresponding pluggable module configured to be mated with the corresponding communication connector, the EMI skirt having a bottom skirt member along the bottom wall, a first side skirt member along the first side wall, a second side skirt member along the second side wall and a separator spring plate coupled to the separator wall, the separator spring plate having a base section coplanar with the separator wall along a separator wall plane and separator spring beams extending out of the separator wall plane on both sides of the separator wall plane, the separator spring beams having mating interfaces configured to engage and electrically connect to the corresponding pluggable modules in the corresponding first and second module cavities.

11. The connector assembly of claim 10, wherein the separator spring beams are aligned with each other on opposite first and second sides of the separator wall plane.

12. The connector assembly of claim 10, wherein the separator spring plate has a thickness no wider than a width of the separator wall.

13. The connector assembly of claim 10, wherein the separator spring plate includes a first side skirt member and a second side skirt member, the first side skirt member of the separator spring plate has a width approximately half a width of the separator wall and the second side skirt member of the separator spring plate has a width approximately half the width of the separator wall.

14. The connector assembly of claim 13, wherein the first and second side skirt members of the separator spring plate are directly electrically coupled to the bottom skirt member.

15. The connector assembly of claim 10, wherein the separator wall includes mounting tabs, the separator spring plate having mounting lands mechanically and electrically coupled to corresponding mounting tabs.

16. The connector assembly of claim 10, wherein the separator spring plate includes at least one mounting tab configured to be mechanically and electrically coupled to at least one of the walls of the plurality of walls.

17. The connector assembly of claim 10, wherein the separator wall includes a pocket receiving the separator spring plate, the separator spring plate being mechanically and electrically coupled to the separator wall in the pocket.

18. The connector assembly of claim 10, wherein the separator spring beams extend between fixed ends and distal ends, the separator spring beams being deflectable about the fixed ends, the distal ends being configured to electrically engage the corresponding pluggable modules.

19. A communication system comprising:
   pluggable modules each comprising a pluggable body extending between a mating end and a cable end, the pluggable body having a top and an opposite bottom with sides extending therebetween along a length of the pluggable body, the pluggable body having a mating perimeter defined by the top, the bottom and the sides along a portion of the length forward of the mating end, each pluggable module having an internal circuit board held in the pluggable body; and
   a connector assembly comprising a communication connector and a cage member, the cage member having a plurality of walls extending between a front end and a rear end, the walls being manufactured from a metal material and providing electrical shielding, the walls of the cage member defining first and second module cavities configured to receive corresponding pluggable modules therein through the front end, the first and second module cavities being arranged side-by-side, the first and second module cavities being arranged side-by-side and being defined by a top wall and a bottom wall of the plurality of walls with the bottom wall extending along a circuit board, the first and second module cavities being separated by a separator wall of the plurality of walls, the separator wall being a solid wall devoid of an interior chamber oriented vertically between the top wall and the bottom wall between the first and second module cavities, the first and second module cavities being separated by a separator spring plate coupled to the separator wall, the separator spring plate having a base section coplanar with the separator wall along a separator wall plane, the separator spring plate having first separator spring beams extending out of the separator wall plane to a first side of the separator wall plane into the first module cavity to couple to the corresponding pluggable module received therein, the separator spring plate having second separator spring beams extending out of the separator wall plane to a second side of the separator wall plane into the second module cavity to electrically couple to the corresponding pluggable module received therein.

20. The communication system of claim 19, wherein the separator spring plate includes a first side skirt member and a second side skirt member aligned back-to-back, the first separator spring beams extending from the first side skirt member, the second separator spring beams extending from the second side skirt member.

\* \* \* \* \*